(12) United States Patent
Glass et al.

(10) Patent No.: US 12,463,079 B2
(45) Date of Patent: Nov. 4, 2025

(54) DRY ADHESIVE FOR TEMPORARY BONDING OF SEMICONDUCTOR DEVICES

(71) Applicant: Shin-Etsu Chemical Co., Ltd., Chiyoda-ku (JP)

(72) Inventors: Paul Samuel Glass, Pittsburgh, PA (US); Shree Deshpande, Pittsburgh, PA (US); Justin Bohn, Pittsburgh, PA (US); Elliot Geikowsky, Pittsburgh, PA (US)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 1 day.

(21) Appl. No.: 18/015,275

(22) PCT Filed: Jul. 8, 2021

(86) PCT No.: PCT/US2021/040966
§ 371 (c)(1),
(2) Date: Jan. 9, 2023

(87) PCT Pub. No.: WO2022/011193
PCT Pub. Date: Jan. 13, 2022

(65) Prior Publication Data
US 2023/0260818 A1    Aug. 17, 2023

Related U.S. Application Data

(60) Provisional application No. 63/049,314, filed on Jul. 8, 2020.

(51) Int. Cl.
*B32B 41/00*     (2006.01)
*H01L 21/683*    (2006.01)

(52) U.S. Cl.
CPC .................. *H01L 21/6836* (2013.01)

(58) Field of Classification Search
CPC ....... H01L 21/6836; H01L 2221/68318; H01L 2221/68381; H01L 21/6835
USPC ................ 156/60, 64, 350, 351, 378, 379
See application file for complete search history.

(56) References Cited

U.S. PATENT DOCUMENTS

| 6,722,026 B1 | 4/2004 | Lent |
| 9,079,215 B2 | 7/2015 | Sitti et al. |
| 9,605,181 B2 | 3/2017 | Lu |

(Continued)

FOREIGN PATENT DOCUMENTS

JP    2019501279 A    1/2019

OTHER PUBLICATIONS

Aranzazu del Campo et al. Contact Shape Controls Adhesion of Bioinpired Fibrillar Surfaces, Langmuir, published on web Aug. 28, 2007, pp. 10235-10243, vol. 23, American Chemical Society.

(Continued)

*Primary Examiner* — Michael N Orlando
*Assistant Examiner* — Joshel Rivera

(57) ABSTRACT

A dry adhesive microfiber array comprising a plurality of fibers with enlarged tips, where the dry adhesive is capable of adhering to a surface of a silicon wafer and/or carrier. The dry adhesive can be debonded without the use of chemicals or heat and does not leave a residue on the surface of the wafer. In addition, a liquid can be introduced to the interface between the dry adhesive and semiconductor device to adjust the force of adhesion.

17 Claims, 2 Drawing Sheets

(56) References Cited

U.S. PATENT DOCUMENTS

| | | | |
|---|---|---|---|
| 2010/0136281 A1* | 6/2010 | Sitti | .................. A44B 18/0049 |
| | | | 428/92 |
| 2010/0252177 A1 | 10/2010 | Sargent | |
| 2015/0329743 A1 | 11/2015 | Lu et al. | |
| 2015/0368519 A1 | 12/2015 | Sitti et al. | |
| 2015/0376465 A1* | 12/2015 | Sitti | ........................ B29C 39/24 |
| | | | 264/299 |
| 2019/0256970 A1 | 8/2019 | Lau | |

OTHER PUBLICATIONS

Office Action issued for counterpart Japanese Application No. 2023-501633, transmitted from the Japanese Patent Office on Apr. 30, 2025 (drafted on Apr. 24, 2025).

\* cited by examiner

DRY ADHESIVE FOR TEMPORARY BONDING OF SEMICONDUCTOR DEVICES

CROSS-REFERENCE TO RELATED APPLICATIONS

This application claims the benefit under 35 U.S.C. § 119 of Provisional Application Ser. No. 63/049,314, filed Jul. 8, 2020, which is incorporated herein by reference.

STATEMENT REGARDING FEDERALLY SPONSORED RESEARCH

Not applicable.

BACKGROUND

The invention relates generally to dry adhesives. More specifically, the invention relates to dry adhesives comprising an array of micro- and nano-scale fiber arrays that can be used to temporarily bond silicon wafers to a carrier during manufacturing.

Semiconductor manufacturing involves several processing steps. For example, a silicon wafer being fabricated into a processor may undergo cleaning, passivation, photolithography, etching, deposition, polishing, grinding, dicing, chip/die packaging, etc. Careful handling of the wafers, dies, and other semiconductor devices is required during each processing step to improve throughput, reduce the footprint of equipment, reduce/prevent particle contamination, and maintain high yields. Growing implementation of wafer level packaging (WLP) processes has increased the need for suitable wafer handling technologies. In WLP processes, the packaging of the die occurs while the die is still on the wafer, which have become thinner driven by the diversity of mobile devices that use semiconductor chips/devices. To enable the handling of thin wafers for WLP, the fabrication process can include the temporary bonding of the wafer to a carrier or substrate. Because some of the processing steps are performed on the backside of the wafer, temporary bonding occurs on the device-side of the wafer, making the bonding-debonding process (BDB) very critical to prevent damage to the device-side of the wafer. In general, the temporary bonding material can be expected to provide adhesion to large surfaces, adhere to high-stress substrates, and provide adhesion over a range of temperatures.

Temporary bonding can be achieved through several techniques. In one example, a liquid adhesive is used between the wafer and the carrier. With adhesive bonding, a liquid thermoplastic adhesive is spin coated onto the device-side of the wafer then cured at elevated temperatures of about 200-250° C. These additional steps can lower throughput and add to overall costs. Moreover, upon completion of processing, the wafer must be debonded from the carrier through means such as chemicals, heat, or lasers. With chemical debonding, the wafer is exposed to solvents which increases the likelihood of contamination and is not time effective for large wafers. When using heat for debonding, the elevated temperatures can bow or warp the substrate and lead to yield inefficiencies. Lastly, laser debonding requires a transparent carrier, which can require changes to other processing steps as wafer detection and alignment systems are often sight-based systems. In another example temporary bonding technique, pressure sensitive adhesive tapes are used. However, these types of tapes can leave a residue after debonding, requiring further processing steps to remove the residue from the wafer. Further, with many of these existing techniques, the bonding strength is determined by the inherent properties of the adhesive materials used and cannot be tuned easily for a particular application.

Therefore, it would be advantageous to develop a dry adhesive that overcomes these limitations by providing an efficient bonding/debonding process with decreased potential for decontamination and wafer damage, while also allowing for fine tuning of bond strength.

BRIEF SUMMARY

According to one embodiment of the present invention is a dry adhesive having an array of fibers capable of adhering to smooth flat surfaces and patterned surfaces, such as the surface of a silicon wafer. The dry adhesive, in one embodiment, comprises an array of micro- or nano-scale fibers extending from a surface, where the fibers have an enlarged, shaped tip. The tips make contact with the surface of the wafer and provide an adhesion force. Removal can be accomplished by peeling the dry adhesive from the wafer or moving the wafer in a direction parallel to the surface of the dry adhesive. In addition, the dry adhesive is affected by wetting, which can increase the force of adhesion. As a result, introducing a liquid, such as water or isopropyl alcohol, can be used to adjust the adhesion properties of the adhesive.

The dry adhesive can be formed as a thin film, a tape, or fabricated directly onto the surface of the carrier. Debonding the dry adhesive does not require chemicals or complicated processing steps other than physical removal of the wafer from the carrier. Since the dry adhesive does not consist of complex multi-component liquid adhesives, there is significant reduction in the amount of residue left on the surface of the wafer after debonding.

DETAILED DESCRIPTION

Figure 1:
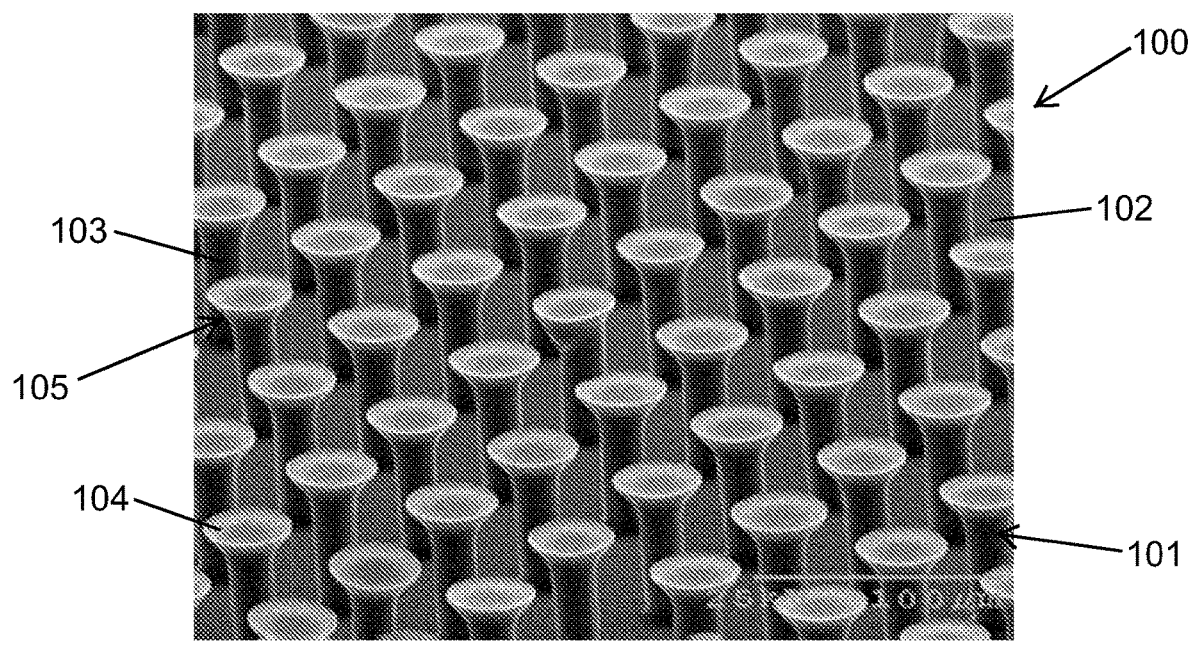
FIG. 1 is an image showing the structure of the dry adhesive, according to one embodiment.

In one example embodiment, the dry adhesive microfiber array 100 comprises a plurality of fibers 101 attached to a backing layer, carrier, or substrate 102. In one embodiment, the fiber 101 attaches to the backing layer, carrier, or substrate 102 at a substantially perpendicular angle. Each fiber includes stem 103 and an enlarged tip 104 (i.e. the radius of the tip is greater than the radius of the stem). In one embodiment, the tip 104 is a mushroom-shaped tip 104 with a flat surface. The stem 103 and tip 104 are symmetrical about symmetry axis, such that radius a of the stem 103 (up to the point of connection 105 with the tip 104) is constant along the length of stem 103. However, in alternative embodiments, the radius of the stem 103 can vary along its length, including one embodiment where the radius of the stem 103 near the backing layer 102 is enlarged. The tip 104 is also symmetrical and is fixed in radial direction to enable increased contact with the surface of the semiconductor device, such as a silicon wafer, chip, die, semiconductor package, or other similar device. In one embodiment, the surface of the tip 104 and the cross-section of the stem 103 are circular. In other embodiments, however, an oval or elliptical shape and/or cross-section may be used. The shape of the sides on the underside of the mushroom tip 104 is linear but, alternatively, can be convex or concave with respect to the stem axial direction and tip surface.

In an alternative embodiment, the dry adhesive 100 may comprise a film or tape having fibers on opposing sides, similar to double-sided tape. In this configuration, the tape 100 can be placed on the carrier, with the semiconductor device then placed on top of the tape 100. During debonding, the manufacturer has the option to remove the carrier from the device or to remove the device from the carrier. For example, if a wafer will be transferred to a different carrier for a subsequent processing step, the wafer and tape 100 can be removed from the carrier and be placed on the surface of the different carrier. Because the dry adhesive fiber array 100 does not lose adhesion when removed, it will adhere to the different carrier. By leaving the dry adhesive 100 affixed to the wafer, the handling steps involving the device-side of the wafer is reduced.

During the bonding process, a plurality of fibers 101 of the dry adhesive 100 attaches, adheres, or otherwise bonds, as is known in the art, to the surface of the device. More specifically, the tip 104 of the fibers 101 contacts the surface of the device and provides an adhesive force. The bonding strength of the dry adhesive 100 can be tailored to a particular processing step. For example, if the device is undergoing a cleaning step where it will not be subjected to large forces or rough handling, a lower bonding strength can be used. The use of a lower bonding strength decreases the chances damaging the device when debonding. Bonding strength can be adjusted by varying the parameters of the fiber design, including fiber length, fiber radius, backing layer thickness, tip diameter, tip height, the angle between the surface of the tip and the side of the tip, fiber density, and material choice. In one example embodiment, the fiber 101 is constructed from polyurethane in a molding process known to those having skill in the art. In this example embodiment, the dry adhesive 100 may have fibers 101 with a 4 µm stem radius, 8 µm tip radius, and 20 µm length.

Figure 2:
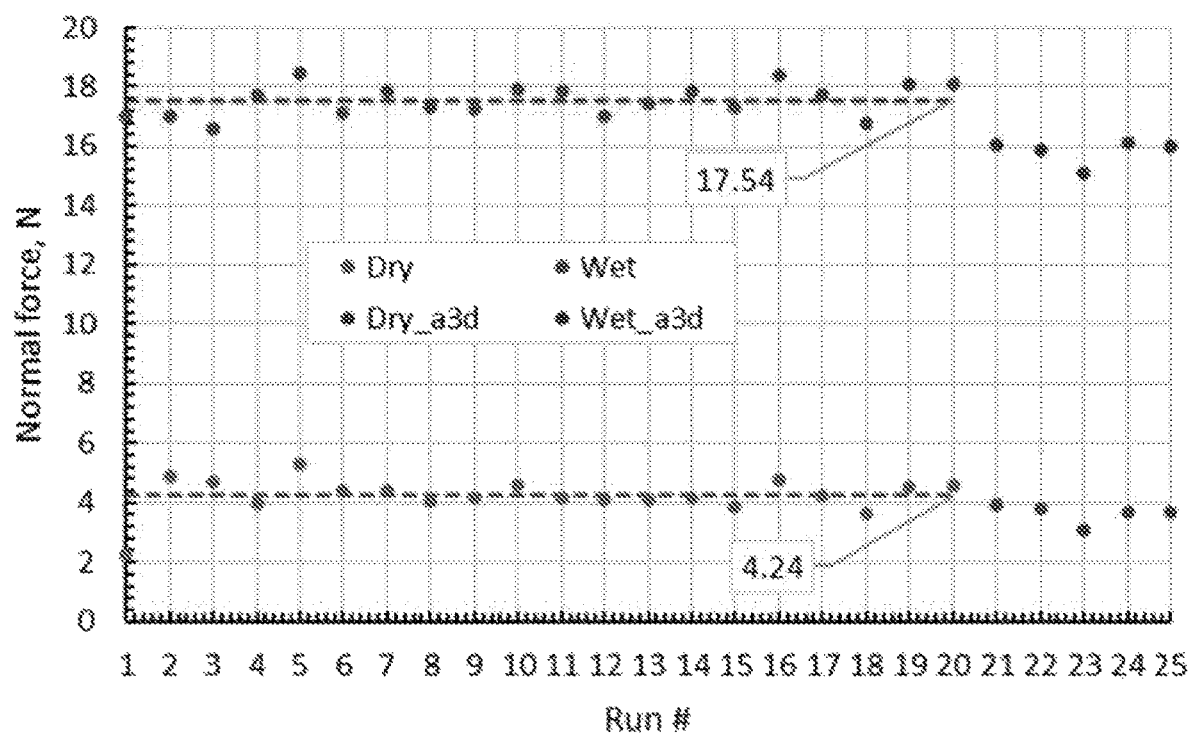
FIG. 2 is a graph showing adhesion forces for an adhesive in a dry and wet state.

As previously discussed, the fiber characteristics can be varied to adjust bonding strength. The presence of a liquid, such as water or isopropyl alcohol, can also affect the adhesion properties of the dry adhesive 100. Although a liquid is present, the adhesive 100 is still considered a dry adhesive since the liquid is not providing direct adhesion, like a glue. That is, the liquid is not an adhesive. Rather, the liquid affects the interface between the surface of the device and the tips 104 of the fibers 101. FIG. 2 shows the force of adhesion for a dry adhesive 100 in two states—dry (bottom line) and wetted with isopropyl alcohol (top line). The y-axis of FIG. 2 shows the normal force in Newtons and the x-axis shows individual measurements for the same dry adhesive 100. FIG. 2 depicts a series of twenty measurements, followed by an additional five measurements after three days. The additional five tests are used to show the resiliency of the fibers after being subjected to isopropyl alcohol. As shown in FIG. 2, the presence of isopropyl alcohol increases the force of adhesion in the normal direction compared to the dry adhesive 100.

The difference in adhesion between dry and wet states can be utilized in the debonding phase to minimizing the force needed to remove the device from the carrier. For example, a semiconductor device can be bonded to a dry adhesive 100 and wetted with isopropyl alcohol before processing begins. The presence of isopropyl alcohol will increase the adhesion. After processing, the adhesive 100 can be dried using a flow of cold or heated air. Once dried, the force of adhesion will be reduced, allowing easy removal of the semiconductor device from the carrier.

The dry adhesive 100 provides unique advantages over existing mechanisms for bonding and debonding. For example, the dry adhesive 100 of the present invention can be bonded and debonded at room temperature, preventing any unnecessary heat exposure and potential defects from varying coefficients of thermal expansion. Further, since all debonding processes are different (i.e. there is no standard debonding process), the ability to tailor bonding strength means the adhesion only needs to be strong enough to maintain attachment throughout a process, while ensuring the mechanical removal step does not damage the device side of the wafer. Consequently, compared to existing bonding mechanisms, the dry adhesive fiber array 100 can increase process throughput, simplify processing, provide a low temperature bonding process, and enable a high yield.

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilized for realizing the invention in diverse forms thereof. In particular, one or more features in any of the embodiments described herein may be combined with one or more features from any other embodiments described herein.

Protection may also be sought for any features disclosed in any one or more published documents referred to and/or incorporated by reference in combination with the present disclosure.

What is claimed is:

1. An apparatus for processing a semiconductor device comprising:
   a carrier;
   a microfiber array having a plurality of fibers terminating in enlarged tips, wherein the microfiber array is affixed to the carrier, wherein the enlarged tips are adapted to contact a surface of the semiconductor device, wherein the enlarged tips are adapted to release from the semiconductor device through a mechanical movement;
   a liquid disposed at an interface between the enlarged tips and the surface of the semiconductor device, wherein the liquid is adapted to increase a force of adhesion of the interface between the enlarged tips and the surface of the semiconductor device.

2. The apparatus of claim 1, wherein the liquid is dryable.

3. The apparatus of claim 2, wherein the liquid comprises water or alcohol.

4. The apparatus of claim 3, wherein the liquid comprises isopropyl alcohol.

5. The apparatus of claim 1, wherein the liquid does not provide direct adhesion.

6. The apparatus of claim 1, wherein the liquid is not an adhesive.

7. A method comprising:
   providing a microfiber array having a plurality of fibers, the plurality of fibers terminating in enlarged tips, the microfiber array being affixed to a carrier;
   wetting an interface between the enlarged tips and the surface of a semiconductor device the microfiber array to increase a force of adhesion of the interface between the enlarged tips and the surface of the semiconductor device;
   adhering a surface of the semiconductor device to the microfiber array after wetting the enlarged tips; and manipulating a position of the carrier while the surface of the semiconductor device is adhered to the microfiber array.

8. The method of claim 7, further comprising:
adjusting a bond strength of the microfiber array by varying the density of the plurality of fibers.

9. The method of claim 7, further comprising:
drying the microfiber array prior to removing the semiconductor device from the carrier.

10. The method of claim 7, wherein the liquid comprises water or alcohol.

11. The method of claim 10, wherein the liquid comprises isopropyl alcohol.

12. The method of claim 7, wherein the semiconductor device comprises a silicon wafer.

13. The method of claim 12, further comprising:
debonding the microfiber array from the silicon wafer through a mechanical movement.

14. The method of claim 13, wherein the mechanical movement comprises peeling the microfiber array from the silicon wafer.

15. The method of claim 13, wherein the mechanical movement comprises a movement of the silicon wafer in a direction parallel to a surface of the carrier.

16. The method of claim 7, wherein the liquid does not provide direct adhesion.

17. The method of claim 7, wherein the liquid is not an adhesive.

\* \* \* \* \*